United States Patent
Tagami et al.

(10) Patent No.: US 7,697,323 B2
(45) Date of Patent: Apr. 13, 2010

(54) MAGNETIC STORAGE DEVICE

(75) Inventors: Katsumichi Tagami, Tokyo (JP); Keiji Koga, Tokyo (JP); Tohru Oikawa, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 11/823,063

(22) Filed: Jun. 25, 2007

(65) Prior Publication Data

US 2008/0024935 A1 Jan. 31, 2008

(30) Foreign Application Priority Data

Jun. 27, 2006 (JP) ............................. 2006-177122

(51) Int. Cl.
*G11C 11/00* (2006.01)
(52) U.S. Cl. ...................... 365/158; 365/171; 365/173; 365/148; 365/225.5
(58) Field of Classification Search ................. 365/158, 365/171, 173, 48, 66, 78, 80–93, 100, 130, 365/131, 148, 225.5, 243.5; 216/22; 257/421, 257/E21.665; 438/3; 977/933–935
See application file for complete search history.

(56) References Cited

U.S. PATENT DOCUMENTS 6,559,511 B1 * 5/2003 Rizzo ........................ 257/421

7,002,840 B2 * 2/2006 Kamijima et al. ........... 365/173
2004/0021189 A1 * 2/2004 Yoda et al. .................. 257/421
2005/0117386 A1 * 6/2005 Kamijima et al. ........... 365/158

FOREIGN PATENT DOCUMENTS

| JP | 2000-90658 A | 3/2000 |
|----|----|----|
| JP | 3466470 B2 | 8/2003 |
| JP | 2004-128430 | 4/2004 |

OTHER PUBLICATIONS

Patent Abstracts of Japan Publication No. 11-274599, entitled Thin Film Magnetic Relectance Element (relevant to JP 3466470 B2).
Patent Abstracts of Japan Publication No. 2000-090658, entitled Magnetic Memory Element (relevant to JP 2000-90658 A).

* cited by examiner

*Primary Examiner*—Son Dinh
*Assistant Examiner*—Harry W Byrne
(74) *Attorney, Agent, or Firm*—Porzio Bromberg & Newman, P.C.

(57) ABSTRACT

A magnetic storage device is provided which has significantly reduced power consumption. The magnetic storage device includes: a yoke which is arranged so as to cover part of a line extending in an arbitrary direction; and a magneto-resistive element which is arranged near the line and is capable of writing information using a field occurring from the line. The magnetic storage device is set to satisfy the equation $Iw \leq a \cdot R + b$, where $Iw$ is the write current necessary for the line, R is the magnetoresistance of the yoke, $a$ (mA·H)=7.5E−11, and $b$ (mA)=0.1.

11 Claims, 15 Drawing Sheets

| No. | YOKE WIDTH (BY_1x) (nm) IW+700nm | YOKE LENGTH (BY_y) (nm) | YOKE HEIGHT (H) (nm) | T-YOKE THICKNESS (TY_z) (nm) | B-YOKE THICKNESS (TY_z) (nm) | GAP (Lg/2) (nm) | WRITE LINE (IW_x) (nm) | READ LINE (TL_z) (nm) | TMR WIDTH (MTJ_x) (nm) | TMR LENGTH (MTJ_y) (nm) | MAGNETIC PATH LENGTH (nm) | CLOSED MAGNETIC PATH LENGTH (nm) | CURRENT Iw (mA) |
|---|---|---|---|---|---|---|---|---|---|---|---|---|---|
| 1 | 1200 | 900 | 300 | 100 | 20 | 10 | 500 | 1100 | 500 | 200 | 2500 | 3000 | 2.34 |
| 2 | 1200 | 900 | 300 | 100 | 20 | 10 | 500 | 1100 | 500 | 350 | 2500 | 3000 | 1.34 |
| 3 | 1500 | 1150 | 300 | 100 | 20 | 10 | 800 | 1400 | 500 | 200 | 3100 | 3600 | 3.75 |
| 4 | 1500 | 1150 | 300 | 100 | 20 | 10 | 800 | 1400 | 800 | 320 | 2800 | 3600 | 2.48 |
| 5 | 1200 | 1500 | 250 | 50 | 20 | 10 | 500 | 1100 | 500 | 200 | 2400 | 2900 | 2.8 |
| 6 | 1200 | 1500 | 250 | 50 | 20 | 10 | 500 | 1100 | 500 | 200 | 2400 | 2900 | 2.7 |
| 7 | 1200 | 1500 | 230 | 100 | 20 | 10 | 500 | 1100 | 500 | 200 | 2360 | 2860 | 1.81 |
| 8 | 1200 | 1500 | 230 | 100 | 20 | 10 | 500 | 1100 | 500 | 350 | 2360 | 2860 | 1.73 |
| 9 | 900 | 450 | 230 | 100 | 20 | 10 | 200 | 500 | 350 | 250 | 1910 | 2260 | 1.02 |
| 10 | 900 | 450 | 230 | 100 | 20 | 10 | 200 | 500 | 300 | 200 | 1960 | 2260 | 1.11 |
| 11 | 900 | 450 | 230 | 100 | 20 | 10 | 200 | 500 | 400 | 270 | 1860 | 2260 | 1.13 |
| 12 | 1800 | 1150 | 180 | 50 | 20 | 10 | 800 | 1400 | 500 | 200 | 3460 | 3960 | 2.88 |
| 13 | 1800 | 1150 | 180 | 50 | 20 | 10 | 800 | 1400 | 800 | 320 | 3160 | 3960 | 2.87 |
| 14 | 900 | 450 | 230 | 100 | 20 | 10 | 200 | 500 | 300 | 200 | 1960 | 2260 | 0.9 |
| 15 | 900 | 450 | 230 | 100 | 20 | 10 | 200 | 500 | 300 | 200 | 1960 | 2260 | 1.13 |
| 16 | 900 | 900 | 230 | 100 | 20 | 10 | 200 | 500 | 300 | 200 | 1960 | 2260 | 0.98 |
| 17 | 900 | 900 | 180 | 50 | 20 | 10 | 200 | 500 | 300 | 200 | 1860 | 2160 | 0.54 |

| No. | YOKE WIDTH (BY_1x) (nm) IW+700nm | YOKE LENGTH (BY_y) (nm) | YOKE HEIGHT (H) (nm) | T-YOKE THICKNESS (TY_z) (nm) | B-YOKE THICKNESS (TY_z) (nm) | GAP (Lg/2) (nm) | WRITE LINE (IW_x) (nm) | READ LINE (TL_x) (nm) | TMR WIDTH (MTJ_x) (nm) | TMR LENGTH (MTJ_y) (nm) | MAGNETIC PATH LENGTH (nm) | CLOSED MEGNETIC PATH LENGTH (nm) | CURRENT Iw (mA) |
|---|---|---|---|---|---|---|---|---|---|---|---|---|---|
| 1 | 3000 | 350 | 600 | 100 | 20 | 24 | 900 | 900 | 200 | 350 | 7000 | 7200 | 24 |
| 2 | 3000 | 350 | 600 | 100 | 20 | 24 | 900 | 900 | 350 | 350 | 6850 | 7200 | 26 |
| 3 | 3000 | 350 | 600 | 100 | 20 | 24 | 900 | 900 | 500 | 350 | 6700 | 7200 | 20 |
| 4 | 3000 | 500 | 600 | 100 | 20 | 24 | 900 | 900 | 200 | 500 | 7000 | 7200 | 15 |
| 5 | 3000 | 500 | 600 | 100 | 20 | 24 | 900 | 900 | 350 | 500 | 6850 | 7200 | 20 |
| 6 | 3000 | 500 | 600 | 100 | 20 | 24 | 900 | 900 | 500 | 500 | 6700 | 7200 | 12 |

MAGNETIC STORAGE DEVICE

BACKGROUND OF THE INVENTION

1. Field of the Invention

The invention relates to a magnetic storage device which stores information in magneto-resistive elements.

2. Description of the Related Art

MRAM (Magnetic Random Access Memory) has been receiving attention recently as a storage device for use in information processors such as computers and communication apparatuses. MRAM stores data by means of magnetism. Since the direction of magnetization can be maintained without use of any electrical means, it is possible to avoid any loss of information upon power-down as happens with DRAM (Dynamic Random Access Memory) and SRAM (Static RAM), or other volatile memories. When compared with conventional nonvolatile storing means such as flash EEPROM and hard disk units, MRAM is superior in terms of access speed, reliability, power consumption, and the like. It can thus be said that MRAM is capable of replacing all the functions of volatile memories such as DRAM and SRAM and those of nonvolatile storing means such as flash EEPROM and hard disk units (see Japanese Patent Publication No. 3466470).

Consider, for example, the case of developing information equipment that targets so-called ubiquitous computing in which information processing is available regardless of location. A requirement of such ubiquitous computing includes a storage device that is capable of high speed processing with reduced power consumption and that can also avoid loss of information, even upon power-down. MRAM has the potential to meet both of these requirements, and is expected to be adopted by many information apparatuses in the future.

In particular, for tablets, portable information terminals, and the like that are intended to be carried about daily, it is often difficult to secure sufficient power supply. Thus, in order to perform a great deal of information processing in severe use environments, even MRAM of low power consumption requires a further reduction in power consumption during information processing.

Among examples of technologies intended to advance the power savings of MRAM are magnetic storage devices described in Japanese Patent Application Laid-Open Nos. 2000-90658 and 2004-128430. These magnetic storage devices include, in each of their storage areas (memory cells), a bit line, a word line arranged orthogonal to the bit line, a tunneling magneto-resistive (TMR) element arranged at the intersection between the bit line and the word line, and the like. These magnetic storage devices further include a yoke (field control layer) which is arranged near each TMR element so as to surround the bit line and the word line of the same. The yoke is made of a ferromagnetic body having high permeability, and functions to reduce the occurrence of flux leakage from the bit line or the word line, thereby concentrating the flux into the TMR element. This makes it possible to produce a field necessary for inverting the magnetization of the TMR element, even at low power consumption.

It should be appreciated that a TMR element includes: a first magnetic layer (magnetic sensing layer) whose direction of magnetization changes with an external field; a second magnetic layer having a fixed direction of magnetization; and a nonmagnetic insulating layer interposed between the first magnetic layer and the second magnetic layer. This TMR element stores binary data by controlling the direction of magnetization of the first magnetic layer so that the direction of magnetization is parallel or antiparallel with the direction of magnetization of the second magnetic layer.

The smaller the size of the TMR elements used in magnetic storage devices, the greater the effect of the diamagnetic fields occurring inside, and thus the stronger the write fields must be made. Consequently, a contradiction arises because the write currents must be increased if greater integration of the magnetic storage devices is intended. It is generally noted that magnetic storage devices are difficult to miniaturize and difficult to enhance the recoding density thereof.

SUMMARY OF THE INVENTION

The present invention has been developed in view of the foregoing problem. It is thus an object of the present invention to clarify that magnetic storage devices can be significantly miniaturized, and to achieve a reduction in power consumption.

The inventors have made intensive studies, and both theoretically and experimentally found that a scaling rule holds true for magnetic storage devices. This scaling rule can be utilized to achieve the foregoing object of the present invention by the following means.

To achieve the foregoing object, the present invention provides a magnetic storage device including: a line; a yoke made of a magnetic layer covering part of the line; and a magneto-resistive element arranged near the line, wherein the magneto-resistive element near the line is capable of writing information by using a field occurring from the line. The device satisfies the equation $Iw \leq a \cdot R + b$, where Iw (mA) is a write current necessary for the line, R (1/H) is a magnetoresistance of the yoke, a (mA·H)=7.5E−11, and b (mA)=0.1.

To achieve the foregoing object, the magnetic storage device of the present invention further satisfies the equation $Iw \leq a \cdot R + b$, where Iw (mA) is the write current necessary for the line, R (1/H) is the magnetoresistance of the yoke, a (mA·H)=6.0E−11, and b (mA)=0.

To achieve the foregoing object, the magnetic storage device of the present invention is characterized in that the yoke has a sectional area S which is less than or equal to 2E+5 $nm^2$.

To achieve the foregoing object, the magnetic storage device of the present invention is characterized in that: a gap is formed in part of the yoke in the circumferential direction; and the magneto-resistive element is arranged in or between the gap.

To achieve the foregoing object, the magnetic storage device of the foregoing invention is characterized in that the distances from the gap-forming ends of the yoke to the magneto-resistive element accommodated in the gap are less than or equal to 30 nm.

To achieve the foregoing object, the magnetic storage device of the foregoing invention is characterized in that the magneto-resistive element has a length of 800 nm or less in the direction of the field.

According to the present invention, it is possible to significantly reduce the write current, as well as provide the excellent effect of reducing variations in the values of the write currents of respective magnetic storage devices at the time of mass production and the like.

DETAILED DESCRIPTION OF THE PREFERRED EMBODIMENT

Figure 1:
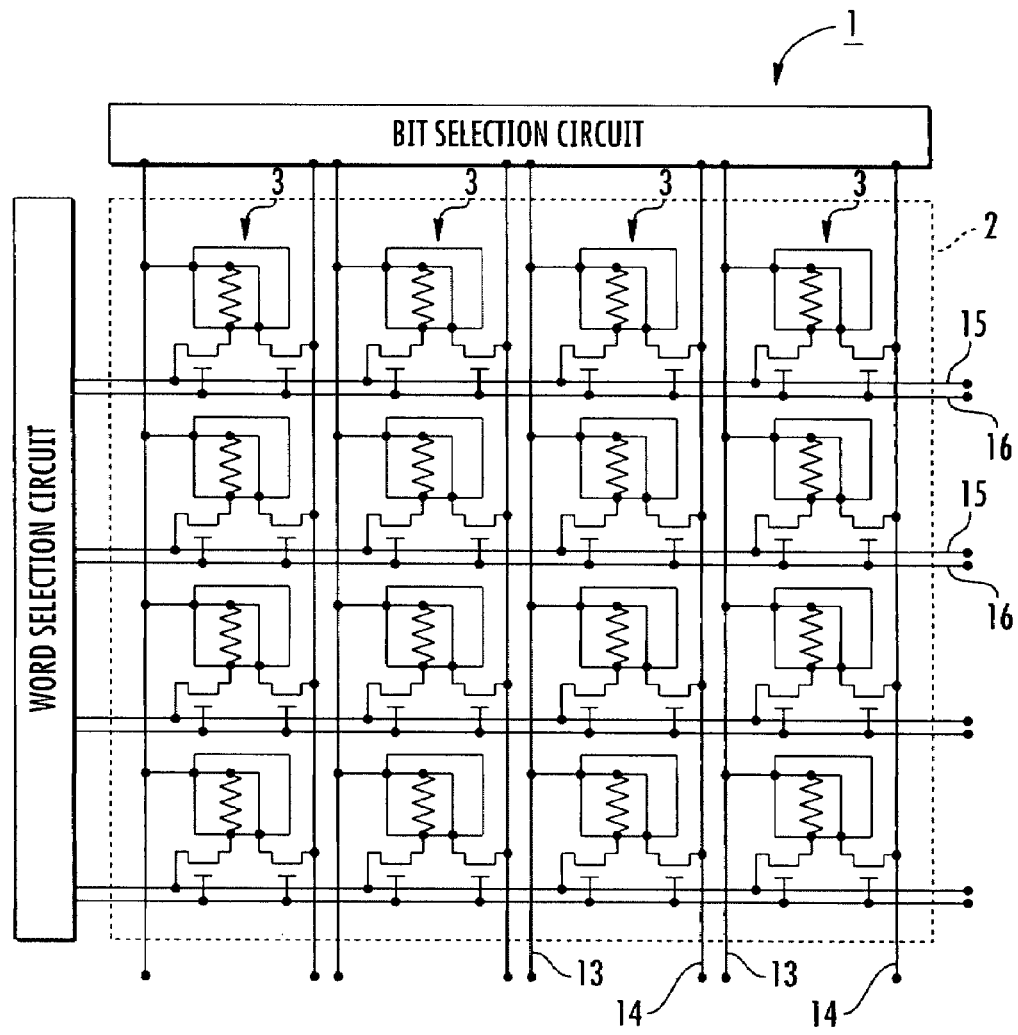
FIG. 1 is a conceptual diagram showing the overall configuration of a magnetic storage device according to an embodiment of the present invention.

Hereinafter, an embodiment will be described in detail. It should be appreciated that the same elements in the drawings will be designated with identical reference numerals, and redundant description will be omitted.

Figure 2:
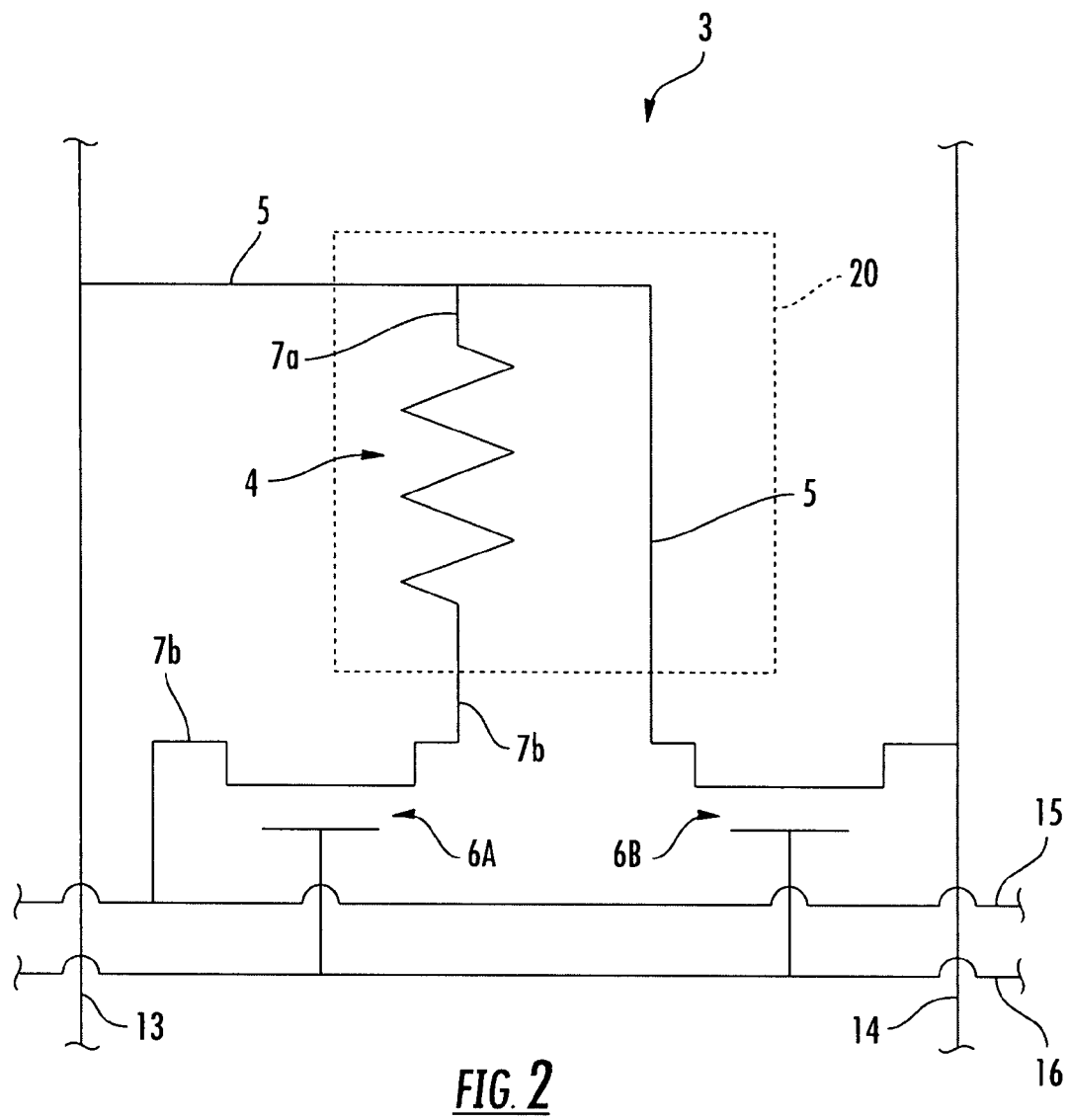
FIG. 2 is a conceptual diagram showing an enlarged storage area of the magnetic storage device of FIG. 1.

FIG. 1 is a conceptual diagram showing the overall configuration of a magnetic storage device 1 according to the embodiment of the present invention. The magnetic storage device 1 includes a storing unit 2, a bit selection circuit 11, a word selection circuit 12, bit lines 13 and 14, and word lines 15 and 16. The storing unit 2 has a plurality of storage areas 3 which are arranged in a two-dimensional configuration (array) with m rows and n columns (m and n are integers not smaller than 2). As shown in an enlarged view of FIG. 2, each storage area 3 has a TMR element 4, a write line 5, a read transistor 6A, a write transistor 6B, read lines 7a and 7b, a ferromagnetic yoke 20, and the like. It should be appreciated that the write line 5 is laid so that it is led in from the bit line 13. It follows that the storage areas 3 are provided with respective write lines 5, ferromagnetic yokes 20, etc. independently. In the present embodiment, the read lines 7a and 7b are arranged so as to branch out from the write line 5. The TMR element 4 is interposed between one read line 7a and the other read line 7b.

The TMR (magneto-resistive) element 4 has the function of changing its own resistance value based on a change in the direction of magnetization. The state of change of this resistance value is utilized to write binary data to the TMR element 4. The direction of magnetization of this TMR element 4 is changed by an external field, which is generated by the write line 5.

The other end of the write line 5, laid so as to be led in from the bit line 13, is electrically connected to the bit line 14. The write transistor 6B is switching means for controlling the conduction of a write current through the write line 5. Its source and drain are interposed in the middle of the write line 5. The gate is connected to the word line 16. Consequently, a current can be passed through the word line 16 to put the write transistor 6B into a conducting state.

One end of the read line 7a is connected to the TMR element 4, and the other end is connected to the write line 5 (or the bit line 13). One end of the read line 7b is connected to the TMR element 4, and the other end is connected to the word line 15. The read transistor 6A is switching means for controlling the conduction of a read current through the read lines 7a and 7b. Its drain and source are interposed in the middle of the read line 7b. The gate is connected to the word line 16. Consequently, a current can be passed through the word line 16 to put the read transistor 6A into a conducting state.

The bit lines 13 and 14 are provided for each individual column of the plurality of storage areas 3 which are arranged in an array. The bit line 13 is connected to the write lines 5 of all the storage areas 3 that pertain to the corresponding column. The bit line 14 is also similarly connected to the write lines 5 of all the storage areas 3 that pertain to the corresponding column. Consequently, if a potential difference is given to between a certain pair of bit lines 13 and 14 when a write transistor 6B is operated to permit conduction, then a write current flows through that write line 5.

The word lines 15 and 16 are provided for each individual row of storage areas 3. The word line 16 is connected to the gates of the read transistors 6A and the write transistors 6B in all the storage areas 3 that pertain to the corresponding row. That is, the word line 16 serves as a line for permitting conduction of both the transistors 6A and 6B. The word line 15 is connected to read lines 7b in all the storage areas 3 pertaining to the corresponding row. Consequently, if a potential difference is given to between a certain pair of a bit line 13 and a word line 15 when write transistors 6A are operated to permit conduction, then a read current flows through those read lines 7a and 7b.

Returning to FIG. 1, the bit selection circuit 11 has the function of providing a positive or negative write current to the write lines 5 of the respective storage areas 3. Specifically, the bit selection circuit 11 includes an address decoder circuit and a current drive circuit. The address decoder circuit selects a predetermined column out of the array of storage areas 3 in accordance with an address designated internally or externally. The current drive circuit applies a positive or negative potential difference to between a pair of bit lines 13 and 14 corresponding to this predetermined column selected, and supplies a write current to the write lines 5 that are laid between the bit lines 13 and 14 in this predetermined column.

The word selection circuit 12 includes an address decoder circuit and a current drive circuit. The address decoder circuit selects a predetermined row out of the array of storage areas 3 in accordance with an address designated internally or externally. The current drive circuit supplies predetermined voltages to the word lines 15 and 16 corresponding to this predetermined row. Thus, the word selection circuit 12 can be used to apply a control voltage to the word line 16 corresponding to the predetermined row so that the read transistors 6A and the write transistors 6B are put into a conducting state.

During a write operation, a positive or negative potential difference is applied to between the bit lines 13 and 14 of the address selected by the bit selection circuit 11. Accordingly, the write transistors 6B of the address selected by the word selection circuit 12 are turned ON. This makes it possible to pass a write current through a specific storage area 3 at the intersection of the bit-side address and the word-side address. Note that the bit line 13 and the word line 15 are put to zero potential difference during a write operation so as not to pass any current through the read lines 7.

During a read operation, the bit selection circuit 11 selects a column corresponding to the address designated internally or externally using its address decoder circuit, and applies a predetermined voltage to the bit line 13 corresponding to that column. Meanwhile, the word selection circuit 12 selects a row corresponding to an address by using its address decoder circuit, and applies a predetermined voltage to the word line 15 corresponding to that row. This provides a read current to between the bit line 13 and the word line 15, and also produces a potential difference across the word line 16 to turn ON the read transistors 6A. As a result, the read current can be passed through a specific storage area 3 at the intersection of the bit-side address and the word-side address. Note that the bit lines 13 and 14 is put to zero potential difference during a read operation so as not to pass any write current.

Figure 3:
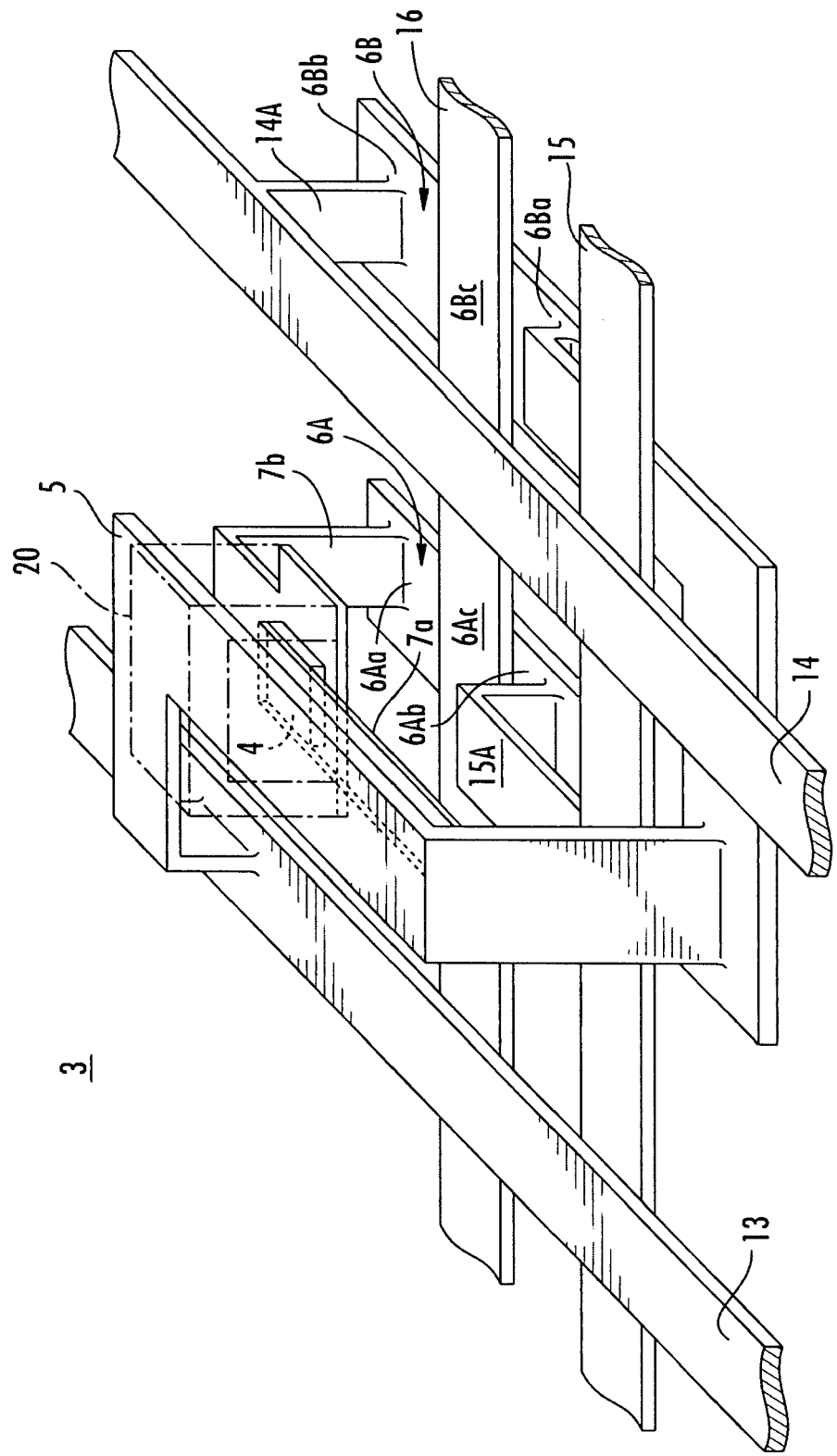
FIG. 3 is an enlarged perspective view showing the internal structure of the storage area in a three-dimensional fashion.

Next, the specific structure of the storage areas 3 in this magnetic storage device 1 will be described in detail. FIG. 3 is a perspective view showing the state of wiring and the like of a storage area 3 in a three-dimensional fashion. The storage area 3 includes, roughly from below, a semiconductor layer, a wiring layer, and a magnetic material layer. The semiconductor layer includes a semiconductor substrate which is not shown in particular. Semiconductor devices such as the read transistor 6A and the write transistor 6B are formed thereon while maintaining the mechanical strength of the entire storage area 3. The magnetic material layer at the top is primarily provided with components that are made of magnetic materials, such as the TMR element 4 and the ferromagnetic yoke 20 for applying a field to the TMR element 4 efficiently. The wiring layer lying in the middle is provided with the bit lines 13 and 14, the word lines 15 and 16, part of the write line 5, the read line 7b, and the like.

The read transistor 6A and the write transistor 6B on the semiconductor layer are formed so that each are surrounded by an insulating area. The insulating area is made of an insulating material such as $SiO_2$. An Si substrate is used as a semiconductor substrate of the transistors, for example. The substrate may be doped with p-type or n-type impurities.

Figure 4:
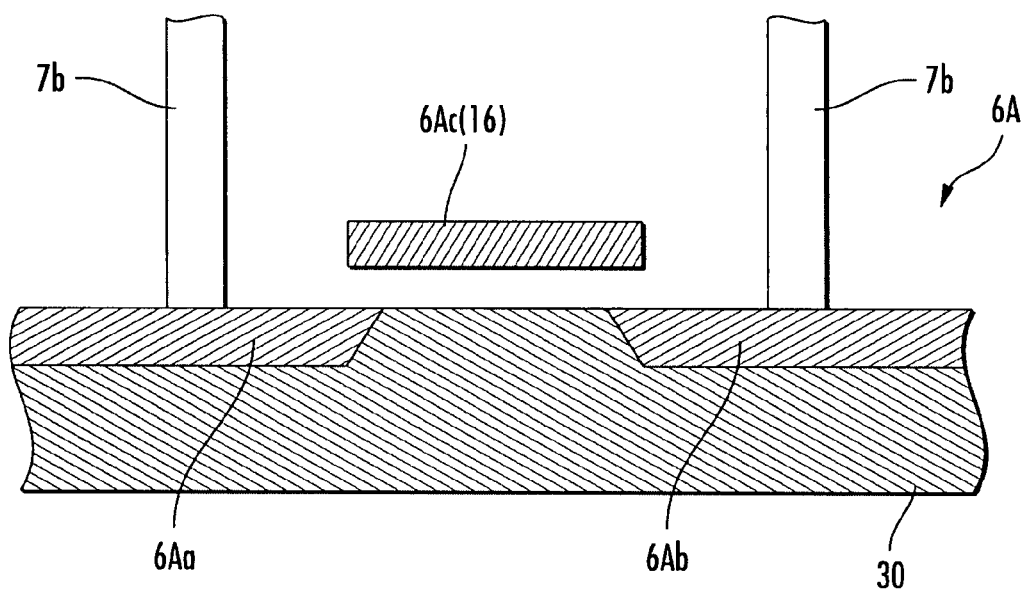
FIG. 4 is a sectional view showing an enlarged structure of a transistor in the storage area.

As shown in an enlarged view of FIG. 4, the read transistor 6A is composed of a drain region 6Aa and a source region 6Ab of conduction type opposite to that of the semiconductor substrate 30, as well as a gate electrode 6Ac and the like. The semiconductor substrate 30 is thus interposed between the drain region 6Aa and the source region 6Ab, and the gate electrode 6Ac is arranged above the semiconductor substrate 30 at a predetermined distance. This gate electrode 6Ac is composed of the word line 16. Because of this configuration, when a voltage is applied to the word line 16, the drain region 6Aa and the source region 6Ab of the read transistor 6A come into conduction with each other so that the read current supplied from the bit line 13 flows through the read line 7a, the TMR element 4, and the read line 7b. It should be appreciated that the write transistor 6B has generally the same configuration. Description thereof will thus be omitted here.

Returning to FIG. 3, the entire area of the wiring layer excluding the wiring such as the bit lines 13 and 14, the word lines 15 and 16, and the read line 7b is occupied by an insulating area. Like the insulating area of the semiconductor layer, this insulating area is also made of an insulating material such as $SiO_2$. The wiring lines may be made of W or Al, for example.

Adjoining the TMR element 4, the write line 5 extends along the plane of array of the storage area 3 and is bent into an L shape within this plane. Both ends of this write line 5 are bent in a direction perpendicular to the plane to become perpendicular lines. The lower end of one of the perpendicular lines is connected to the bit line 13. The lower end of the other perpendicular line makes an ohmic junction with the drain region 6Ba of the write transistor 6B through a horizontal line. A lead 14A corresponding to each individual storage area 3 is branched out of the bit line 14 perpendicularly. Its lower end makes an ohmic junction with the source region 6Bb of the write transistor 6B. As a result, the write line 5 is laid to bridge a pair of bit lines 13 and 14 with the write transistor 6B interposed therebetween.

The read line 7a is extended in the direction of the plane. One of its ends is electrically connected to the TMR element 4, and the other end is connected to the write line 5. One end of the read line 7b is electrically connected to the TMR element 4, and the other end is perpendicularly bent into a perpendicular line. The lower end of this perpendicular line makes an ohmic junction with the source region 6Ab of the read transistor 6A. A lead 15A corresponding to each individual storage area 3 is also perpendicularly branched out of the word line 15. Its lower end makes an ohmic junction with the drain region 6Aa of the read transistor 6A. As a result, the bit line 13 and the word line 16 are electrically connected to each other through part of the write line 5, the read line 7a, the TMR element 4, the read line 7b, and the read transistor 6A which are arranged in this order.

It should be appreciated that the word line 16, extending in the row direction, also functions in part as the gate electrodes 6Ac and 6Bc of the transistors 6A and 6B, respectively. This is equivalent to that the word line 16 is electrically connected to the gate electrodes 6Ac and 6Bc of the respective transistors 6A and 6B.

Figure 5:
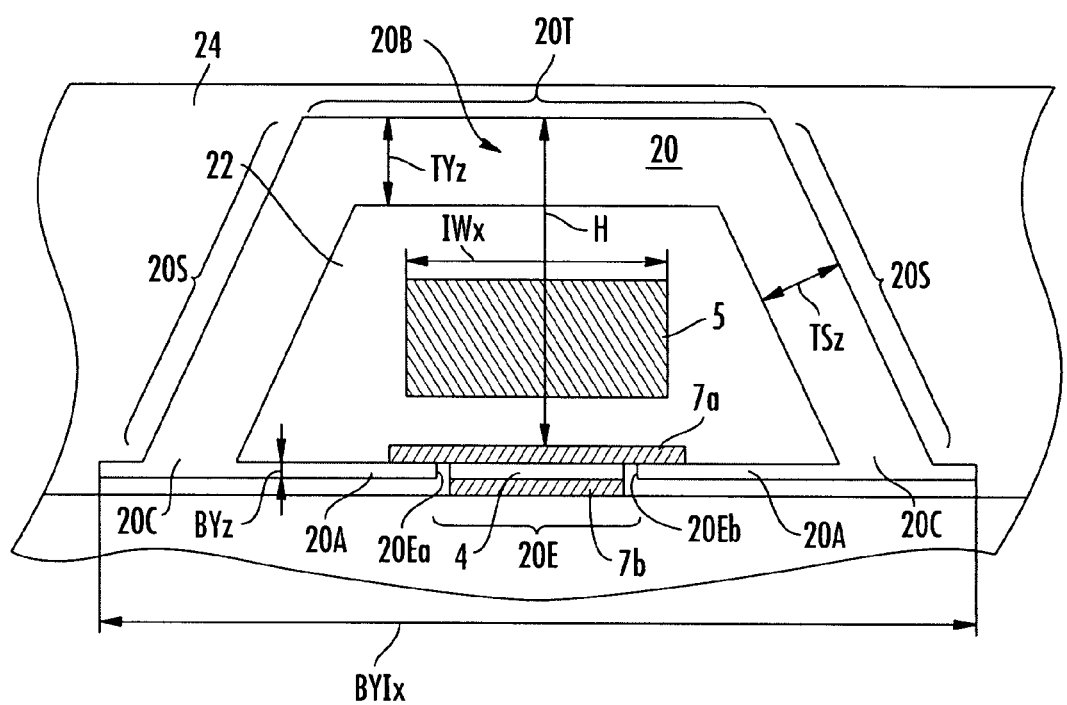
FIG. 5 is a sectional view showing an enlarged structure of the ferromagnetic yoke in the storage area.

Next, the magnetic material layer will be described with reference to FIG. 5 and others. The magnetic material layer includes the TMR element 4, the ferromagnetic yoke 20, part of the write line 5, the read line 7a, and so on. It should be noted that the entire area of the magnetic material layer, excluding the components to be described below and other wiring, is occupied by an insulating area 24.

Figure 6:
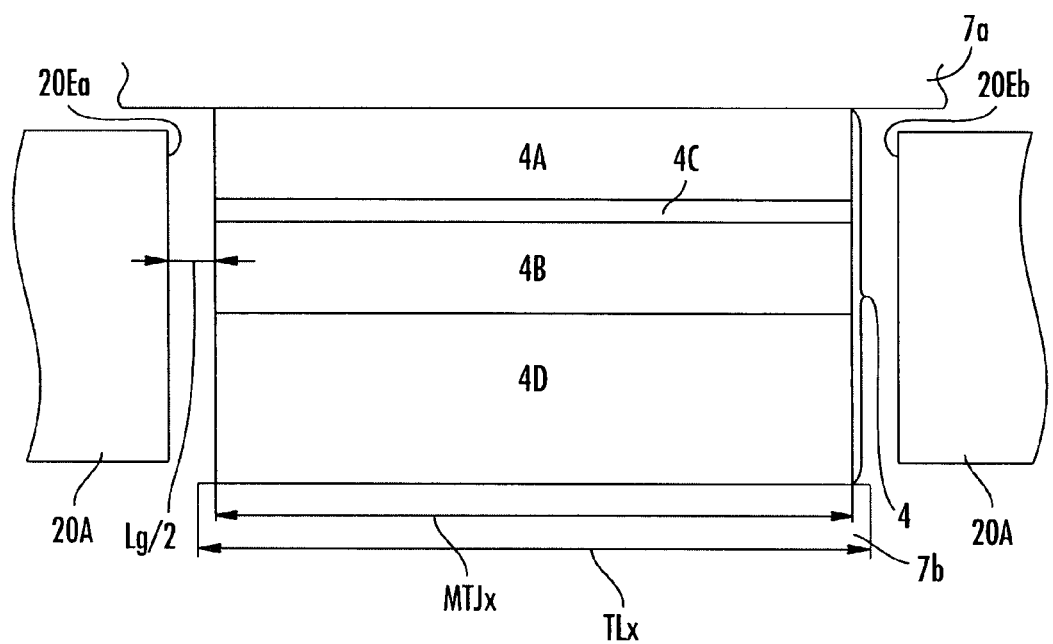
FIG. 6 is a side view showing an enlarged laminate structure of the TMR element to be arranged in the storage area.

As shown enlarged in FIG. 6, the TMR element 4 includes the following layers: 3e; a first magnetic layer (free layer/magnetic sensing layer) 4A having a direction of magnetization changed by an external field; a second magnetic layer (pinned layer) 4B having a fixed direction of magnetization; a nonmagnetic insulating layer (insulator layer) 4C which is interposed between the first magnetic layer 4A and the second magnetic layer 4B; and an antiferromagnetic layer 4D which fixes (pins) the direction of magnetization of the second magnetic layer. In this TMR element 4, when the first magnetic layer 4A undergoes an external field and its direction of magnetization changes, the resistance value between the first magnetic layer 4A and the second magnetic layer 4B changes. This difference in the resistance value can be used to record binary data. The first magnetic layer 4A may be made of ferromagnetic materials such as Co, CoFe, NiFe, NiFeCo, and CoPt.

The direction of magnetization of the second magnetic layer 4B is fixed by the antiferromagnetic layer 4D. That is, exchange coupling at the joint between the antiferromagnetic layer 4D and the second magnetic layer 4B stabilizes the direction of magnetization of the second magnetic layer 4B as oriented in one direction. The direction of the easy axis of magnetization of the second magnetic layer 4B is oriented along that of the first magnetic layer 4A. The second magnetic layer 4B may be made of ferromagnetic materials such as Co, CoFe, NiFe, NiFeCo, and CoPt. The antiferromagnetic layer 4D may be made of such materials as IrMn, PtMn, FeMn, PtPdMn, and NiO, or any combinations of these.

The nonmagnetic insulating layer 4C is made of a nonmagnetic insulating material. It is interposed between the first magnetic layer 4A and the second magnetic layer 4B so as to produce the tunneling magneto-resistive effect (TMR). To be more specific, the nonmagnetic insulating layer 4C characteristically varies in electric resistance depending on the relationship between the directions of magnetization of the first magnetic layer 4A and the second magnetic layer 4B (i.e., in parallel or antiparallel). The nonmagnetic insulating layer 4C is suitably made of oxides or nitrides of such metals as Al, Zn, and Mg.

The first magnetic layer 4A is electrically connected to the read line 7a. The antiferromagnetic layer 4D is electrically connected to the read line 7b. This configuration allows a read current to flow from the read line 7a to the lead line 7b through the TMR element 4, whereby a change in the resistance of the TMR element 4 can be detected. Note that the ferromagnetic yoke 20 is arranged so as to cover an area of the write line 5 adjacent to the TMR element 4. In the TMR element 4, the easy axis of magnetization of the first magnetic layer 4A is oriented across the longitudinal direction of the write line 5 (i.e., across the direction of the write current).

Although not shown in particular, the TMR element 4 may be configured to have a first magnetic layer (free layer/magnetic sensing layer), a nonmagnetic insulating layer (insulator layer), a second magnetic layer, a nonmagnetic metal layer, a third magnetic layer, and an antiferromagnetic layer in this order. The antiferromagnetic layer fixes (pins) the direction of magnetization of the third magnetic layer. Then, the nonmagnetic metal layer can be adjusted in thickness so that the direction of magnetization of the second magnetic layer becomes antiparallel with that of the third magnetic layer. This is ascribable to an exchange interaction that occurs between the second magnetic layer and the third magnetic layer.

Returning to FIG. 5, the ferromagnetic yoke 20 includes an element side yoke 20A and a counter element side yoke 20B. The element side yoke 20A is arranged beside the extending write line 5, on the side of the TMR element 4. The counter element side yoke 20B is arranged beside the write line 5 on the side opposite from the TMR element 4. A pair of yoke connecting portions 20C are arranged on both sides of the element side yoke 20A and on both sides of the counter element side yoke 20B so that they connect the two into a generally annular shape. With respect to the TMR element 4, the element side yoke 20A is thus closer to the TMR element 4 and the counter element side yoke 20B is farther from the TMR element 4. It can also be said that this ferromagnetic yoke 20 itself covers part of the outer periphery of the write line 5. The counter element side yoke 20B is composed of a top area 20T which lies above the write line 5, and slope areas 20S which lie on both sides of this top area 20T, i.e., near the yoke connecting portions 20C. It should be appreciated that the ferromagnetic yoke 20 also has the function of protecting the TMR element 4 from adversely-effecting external fields.

The element side yoke 20A has a gap 20E at the center in the annular direction. The TMR element 4 is interposed in the gap 20E. In an axial view, the ferromagnetic yoke 20 therefore has a general C shape with open ends 20Ea and 20Eb circumferentially in the middle. These open ends 20Ea and 20Eb are located near the sides of the TMR element 4 as extremities of the element side yoke 20A.

The slope areas 20S and the yoke connecting portions 20C guide a field that occurs in the top area 20T toward the element side yoke 20A (i.e., toward the TMR element 4). The internal field occurring in the top area 20T therefore turns around through the slope areas 20S and the yoke connecting areas 20C, thereby forming an internal field of the opposite direction in the element side yoke 20A. In addition to this, the counter element side yoke 20B is shaped so that the slope areas 20S tilt toward the element side yoke 20A. More specifically, the angles P between the top area 20T and the slope areas 20S (see FIG. 7) are set to obtuse angles while the connecting angles of the yoke connecting portions 20C between the element side yoke 20A and the slope areas 20S are set to acute angles. The slope areas 20S are also given a thickness greater than that of the element side yoke 20A.

The top area 20T of the counter element side yoke 20B has a thickness TYz which is greater than the thickness BYz of the element side yoke 20A. For example, the thickness TYz is set to or above 50 nm. The thickness TYz has no particular ceiling as far as magnetoresistance is concerned. The element side yoke 20A, thinner than the counter element side yoke 20B, has a thickness BYz of 10 nm or above. This thickness BYz has no particular ceiling as far as magnetoresistance is concerned. The thickness TSz of the slope areas 20S is set so that the counter element side yoke 20B and the element side yoke 20A are as continuous as possible in terms of magnetoresistance. The counter element side yoke 20B has a maximum height H of, for example, 300 nm or less with respect to the TMR element 4. The width BYlx of the ferromagnetic yoke 20 depends on the width IWx of the write line 5. Specifically, BYlx is set to satisfy the relationship BYlx=IWx+700 nm. Here, the write line 5 has a width IWx of 0.2 μm to 0.8 μm here, and thus BYlx=900 nm to 1500 nm. The ferromagnetic yoke 20 has a depth (dimension in the longitudinal direction of the line) BYy of 0.45 μm to 0.8 μm. As shown in FIG. 6, the width TLx of the read line 7b is set within the range of, for example, 500 nm to 1400 nm. The TMR element 4 has a width MTJx of 0.2 μm to 0.8 μm. Although not shown in particular, the TMR element 4 has a depth MTJy of 0.2 μm to 1.6 μm.

It should be appreciated that this ferromagnetic yoke 20 is preferably manufactured by depositing the slope areas 20S and the top area 20T in a series of processes integrally, which allows a reduction in manufacturing cost. The ferromagnetic yoke 20 is suitably made of ferromagnetic materials such as a metal including at least one element from among Ni, Fe, and Co.

A description of an information write operation on the TMR element 4 in the magnetic storage device 1 of the present embodiment will now be given.

Figure 7:
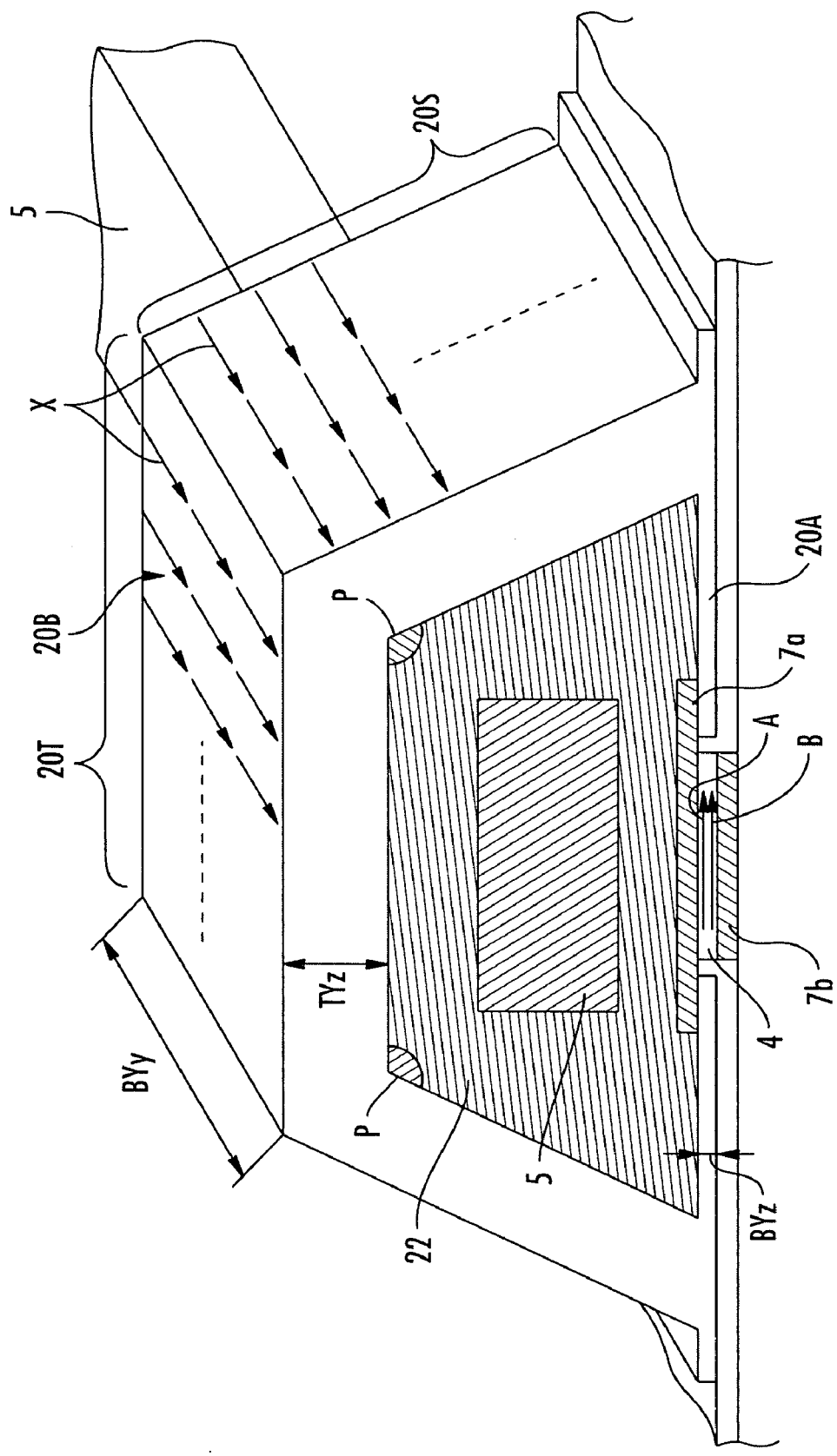
FIG. 7 is a partially sectional perspective view schematically showing a state of magnetization of the ferromagnetic yoke in the storage area.

In the state shown in FIG. 7, if no current is passed through the write line 5, this write line 5 does not produce any field. The magnetization X of the ferromagnetic yoke 20 preferably consists of single domains that generally coincide with the extending direction of the write line 5. If the magnetization X includes a plurality of domains of different directions, an antiferromagnetic layer is desirably overlaid to forcefully make them into single domains. In this instance, it should be noted that the direction of magnetization B of the second magnetic layer 4B and the direction of magnetization A of the first magnetic layer 4A coincide with each other in the TMR element 4. In the present embodiment, the coincidence of the directions of magnetization A and B is defined as binary data of 0 being written.

Figure 8:
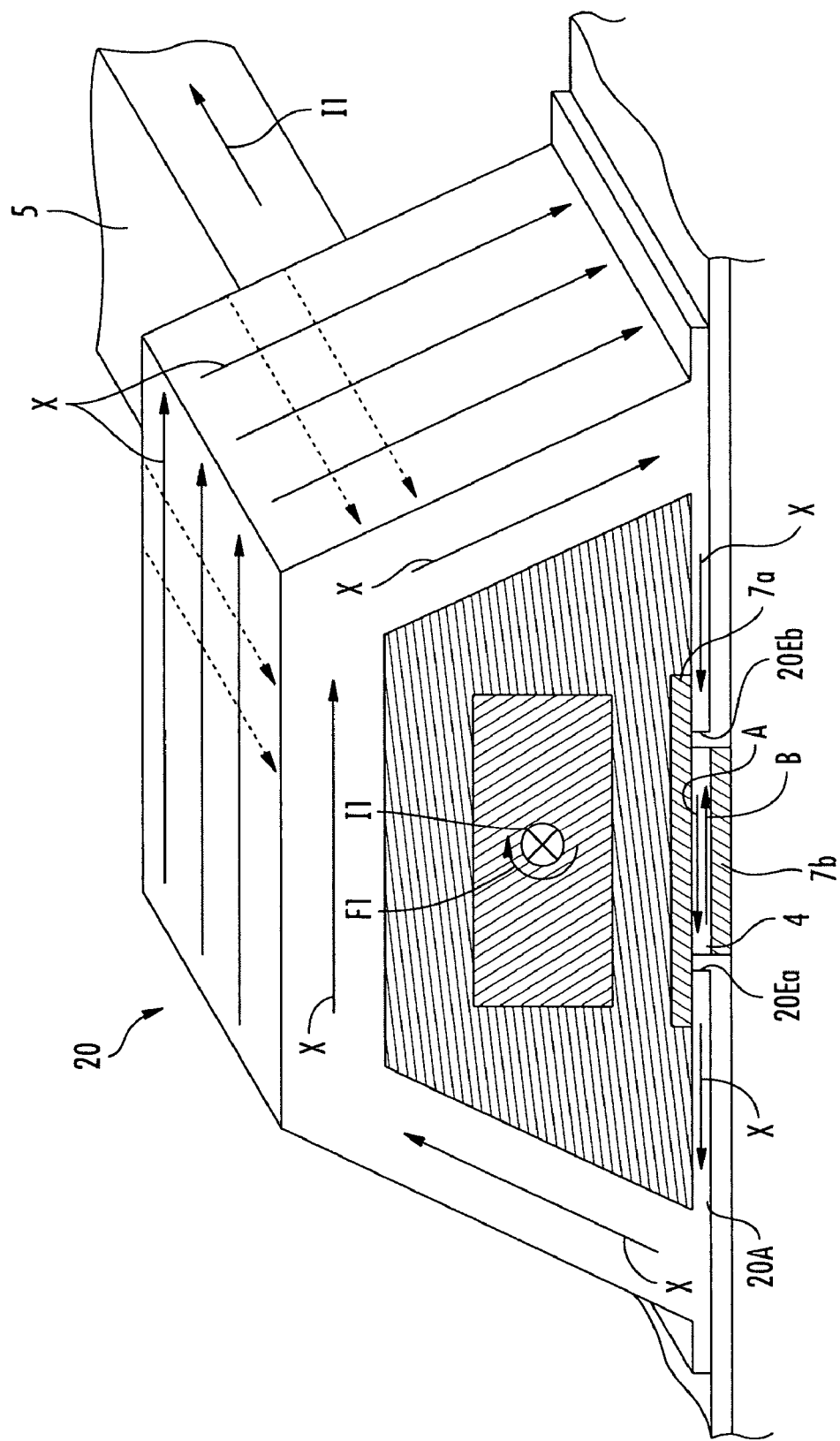
FIG. 8 is a partially sectional perspective view schematically showing a state of magnetization of the ferromagnetic yoke in the storage area.

As shown in FIG. 8, when a write current I1 flows through the write line 5, a circumferential field F1 occurs around the write line 5. The field F1 magnetizes the surrounding ferromagnetic yoke 20 in the direction of the magnetization X, and the ends 20Ea and 20Eb of the element side yoke 20A produce a field. This field is superposed on the field F1 to form a stronger synthetic field, which is guided toward the TMR element 4.

That is, the field F1 occurring from the write line 5 and the field induced by the magnetization X occurring in the ferromagnetic yoke 20 are combined into a strong field. This strong field is concentrated through the element side yoke 20A and applied to the first magnetic layer 4A of the TMR element 4, thereby inverting the direction of magnetization A thereof. If the current I1 of the write line 5 is interrupted in this state, the direction of magnetization A of the TMR element 4 continues to be inverted as shown in FIG. 8. Since the directions of magnetization A and B are maintained as being opposite to each other, this translates into binary data of 1 being written here.

Figure 9:
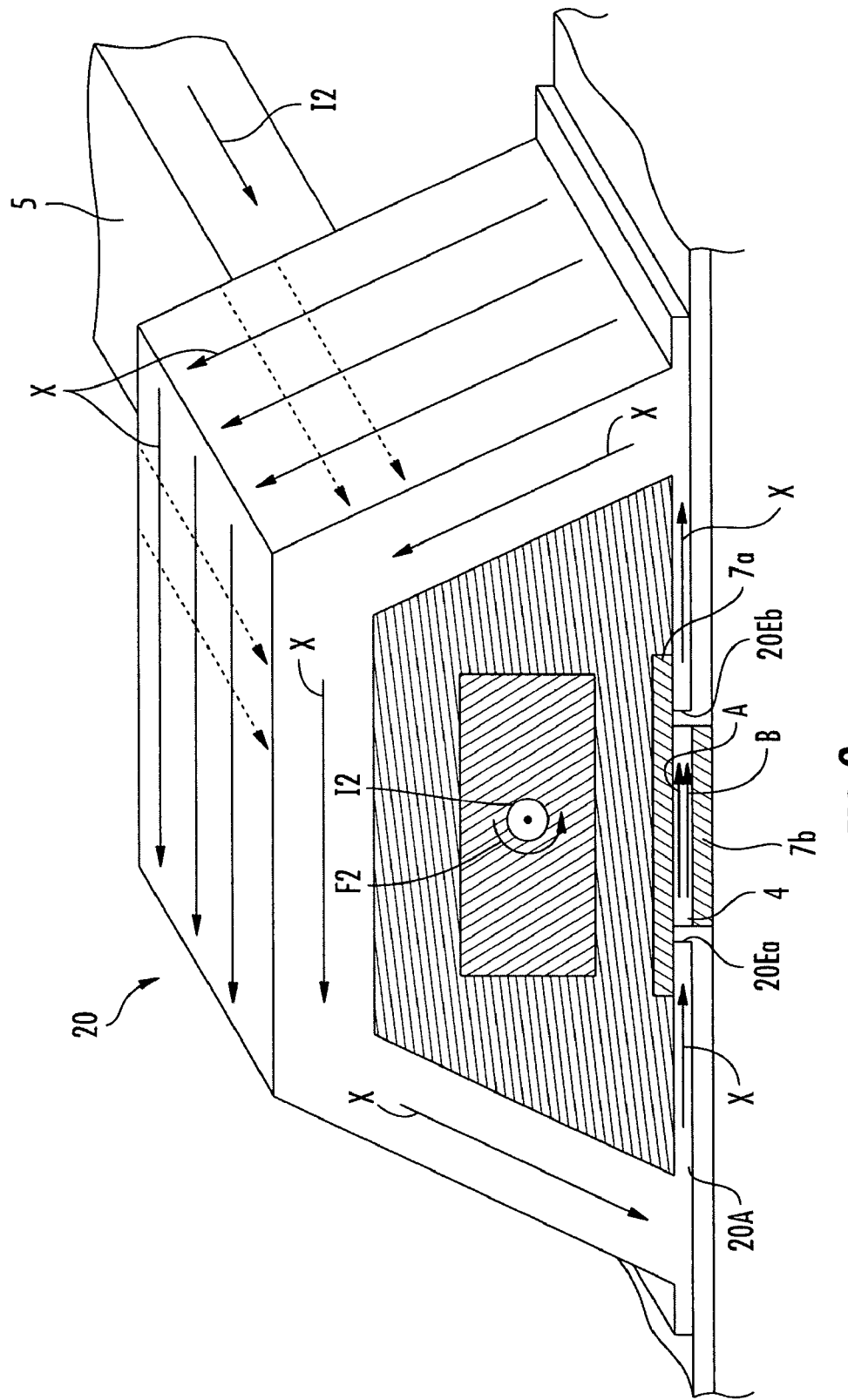
FIG. 9 is a partially sectional perspective view schematically showing a state of magnetization of the ferromagnetic yoke in the storage area.

As shown in FIG. 9, when a write current I2 in a direction reverse to I1 flows through the write line 5, a circumferential field F2 occurs around the write line 5. As if induced by the field F2, the magnetization X of the surrounding ferromagnetic yoke 20 turns 90° into the same direction as that of the field F2.

Consequently, the field F2 occurring from the write line 5 and the field induced by the magnetization X occurring in the ferromagnetic yoke 20 are combined into a strong field. This strong field is concentrated through the element side yoke 20A and applied to the first magnetic layer 4A of the TMR element 4, thereby inverting the direction of magnetizations. The direction of magnetization A of the first magnetic layer 4A then coincides with the direction of magnetization B of the second magnetic layer 4B again. Since the directions of magnetization A and B coincide with each other in the TMR element 4, this translates into binary data of 0 being written again.

When reading the binary data written in the TMR element 4, a read current is passed through the read lines 7a and 7b to detect a change in the potential difference between the lines. This clarifies the resistance of the TMR element 4 to determine which binary data is recorded (i.e., whether the direction of magnetization A of the first magnetic layer 4A is in parallel or antiparallel with the direction of magnetization B of the second magnetic layer 4B). For example, if the direction of magnetization A of the first magnetic layer 4A coincides with the direction of magnetization B of the second magnetic layer 4B, the resistance between the first magnetic layer 4A and the second magnetic layer 4B becomes relatively low due to the tunneling magneto-resistive effect (TMR) of the nonmagnetic insulating layer 4C. Conversely, if the direction of magnetization A is opposite to the direction of magnetization B, the resistance between the first magnetic layer 4A and the second magnetic layer 4B becomes relatively high due to the tunneling magneto-resistive effect.

A description of the value of the write current Iw in this magnetic storage device 1 will now be given. Assuming that the magnetoresistance of the ferromagnetic yoke 20 in the magnetic storage device is R, the write current Iw of this magnetic storage device 1 satisfies the following equation (1A):

$$Iw \leq a \cdot R + b, \quad (1A)$$

where a (mA·H)=7.5E−11, and b (mA)=0.1.

It is also desirable to satisfy the following equation (1B):

$$Iw \leq a \cdot R + b, \quad (1B)$$

where a (mA·H)=6E−11, and b (mA)=0.

The magneto resistance R can be expressed as $R=L/S\mu$, where L is the magnetic path length of each portion, S is the sectional area, and $\mu$ is the magnetic permeability. Consider that the magnetoresistance of the top area 20T is R1, the magnetoresistances of the respective slop areas 20S are R2, and the magnetoresistances of the two split portions of the element side yoke 20A are R3. Then, the magnetoresistance R of the ferromagnetic yoke 20 is given by the sum total thereof (namely, $R1+R2\times2+R3\times2$).

Specifically, consider that the depth (length in the wiring direction) BYy of this ferromagnetic yoke 20 is 900 nm, the thickness TYz of the top area 20T is 100 nm, the thickness BYz of the element side yoke 20A is 20 nm, the magnetic path length L1 of the top area 20T is 1200 nm, the magnetic path length L2 of each of the slope areas 20S is 300 nm, and the magnetic path length L3 of each of the portions of the counter element side yoke 20 is 350 nm. Then, the total magnetic path length L is 2500 nm, and the magnetoresistance R of the entire ferromagnetic yoke 20 is 4E+10 (1/H). (See Sample No. 1 in FIG. 14 of the practical example that is described later.) In this example, the write current I turns out to be 2.34 mA, which satisfies both the foregoing equations (1A) and (1B).

A description will now be given as to why this equation (1A) must be satisfied.

The inventors have found that the value R of the magnetoresistance of the ferromagnetic yoke 20 is essential to magnetic storage devices 1 that have a yoke structure like the present embodiment. Specifically, they have found a scaling rule where the write current Iw decreases with the decreasing size of the ferromagnetic yoke 20, provided that the ferromagnetic yoke 20 is arranged around the write line 5 of the magnetic storage device 1 with an appropriate adjustment in shape.

Figure 10:
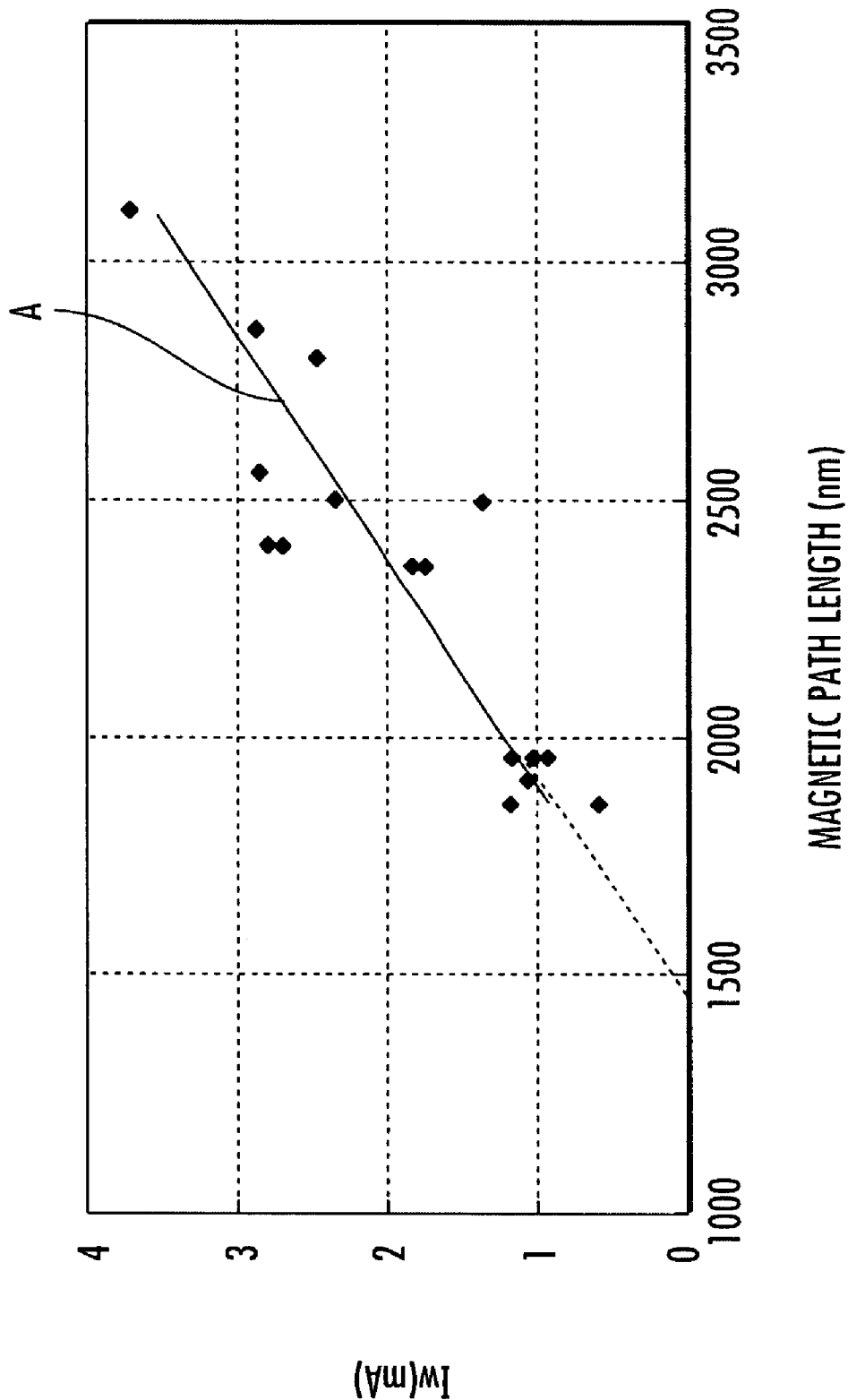
FIG. 10 is a graph showing the results of an analysis of the relationship between the magnetic path length and the write current of the magnetic storage device.

FIG. 10 shows the results of an analysis of the relationship between the magnetic path length of the ferromagnetic yoke 20 and the write current in the magnetic storage device 1 that employs the yoke structure. As is clear from FIG. 10, the shorter the magnetic path length of the ferromagnetic yoke 20 is, i.e., the smaller the ferromagnetic yoke 20 is, the smaller the write current becomes. Meanwhile, according to the regression curve A that is obtained from this analysis, a magnetic path length of 1500 nm would result in zero write current. Such a situation will, in fact, not occur. That is, the scaling rule does not actually hold on an analysis that is based on the magnetic path length alone, as shown in FIG. 10.

Figure 11:
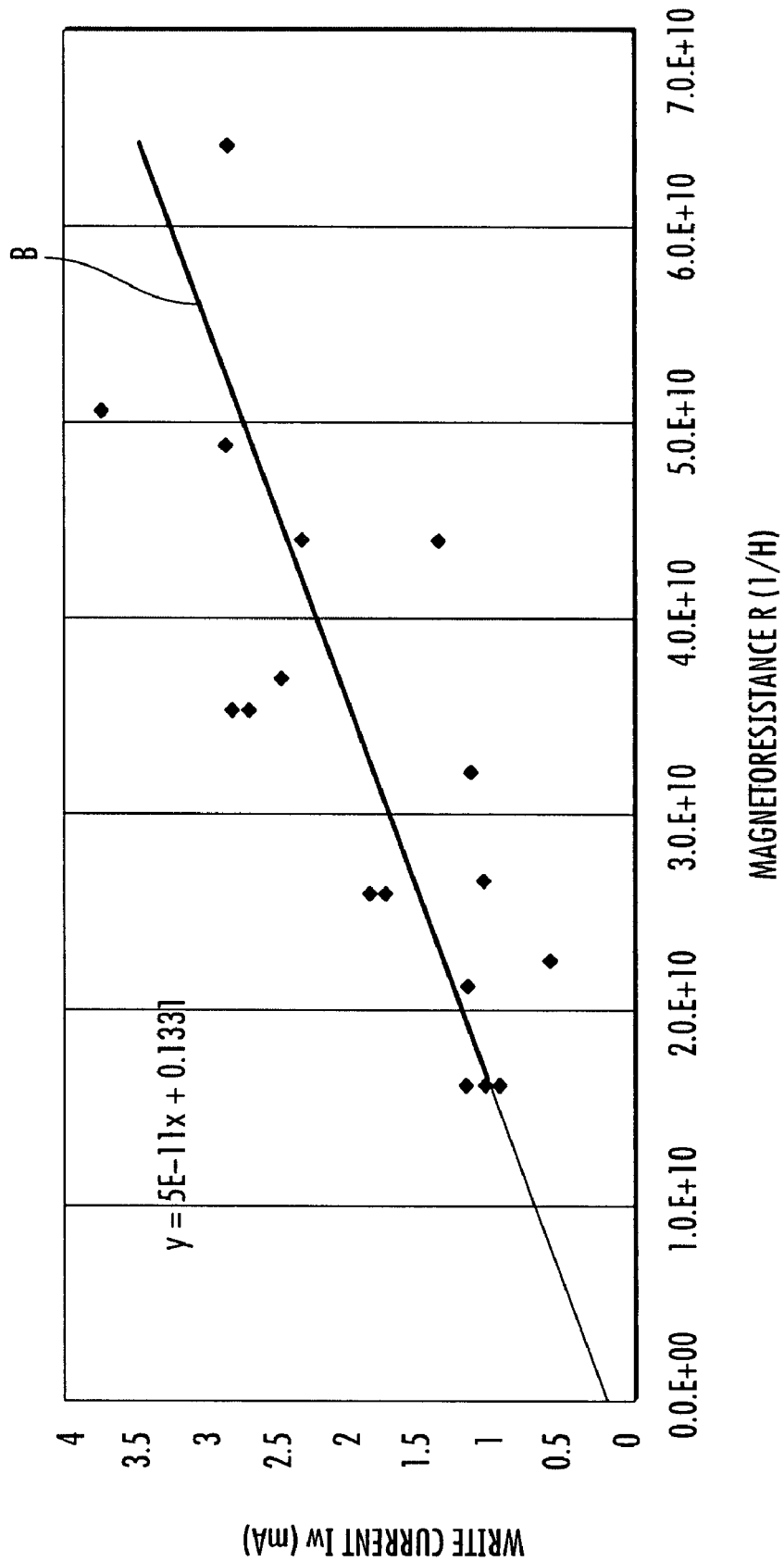
FIG. 11 is a graph showing the results of an analysis of the relationship between the magnetoresistance and the write current of the magnetic storage device.

The inventors then conducted an analysis on the relationship between the magnetoresistance R and the write current Iw, giving attention to the magnetoresistance R of the ferromagnetic yoke 20. The results are shown in FIG. 11. As is evident from the chart, the smaller the magnetoresistance R is, the smaller the write current becomes. The analysis of the regression curve B of FIG. 11 also shows that the magnetoresistance R and the write current I can be converged to near zero. The scaling rule that has been considered not to hold for the magnetic storage device 1 is thus found, in fact, to hold, and this rule can be used effectively to achieve a power saving for the magnetic storage device.

The theoretical reason behind how this scaling rule holds can be estimated as follows.

Figure 12:
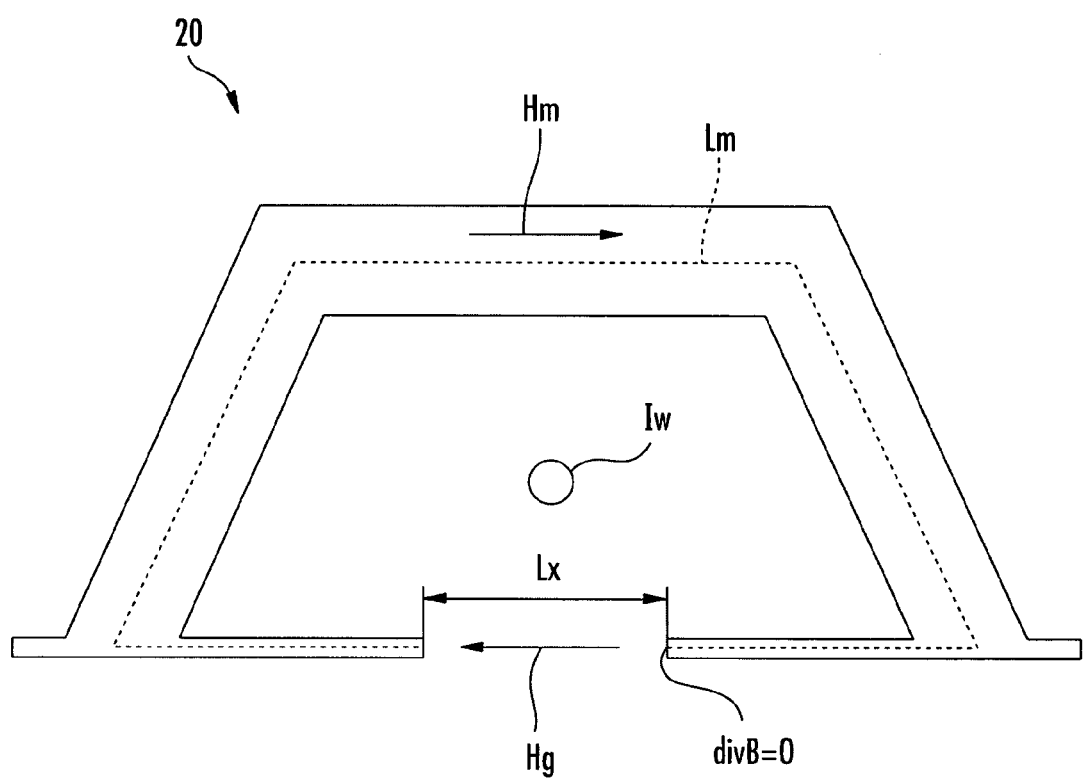
FIG. 12 is a schematic diagram showing a theoretical field of the magnetic storage device in the absence of the TMR element.

Consider, as shown in FIG. 12, that the magnetic path length of the ferromagnetic yoke 20 is Lm, the internal field of the ferromagnetic yoke 20 is Hm, the length of the is Hg, the write current is Iw, and no object lies in this gap 20E in the magnetic yoke 20 is Lx, the field in the gap gap 20E. Using vector analysis formulae, the Maxwell equation can be transformed into contour integration, as given by the following equation (1). This is because the entire field caused by the write current Iw is confined within the ferromagnetic yoke 20 and the field circulates along the ferromagnetic yoke if the ferromagnetic yoke 20 is functioning properly as a magnetic circuit:

$$\text{rot } H = j \rightarrow Hm^*Lm + Hg^*Lx = Iw, \text{ div } B = 0 \rightarrow Hg = M/\mu_0. \quad \text{Eq. (1)}$$

Figure 13:
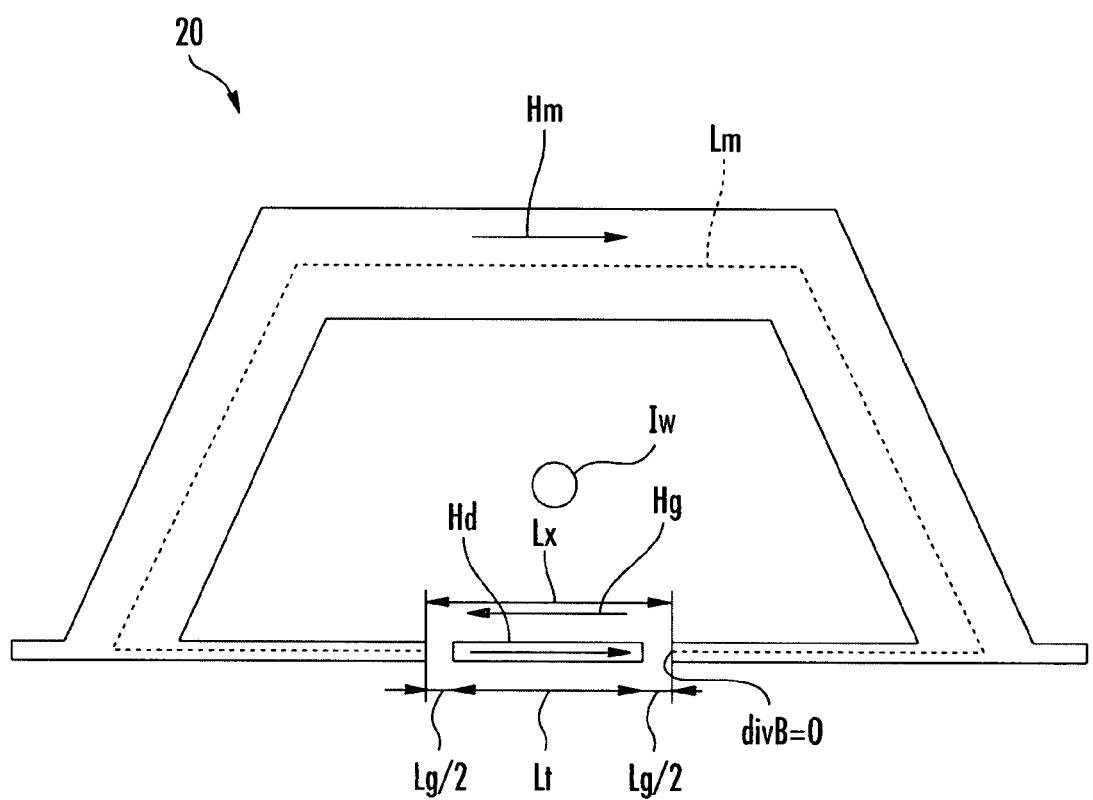
FIG. 13 is a schematic diagram showing a theoretical field of the magnetic storage device in the presence of the TMR element.

Now, as shown in FIG. 13, consider that the magnetic path length of the ferromagnetic yoke 20 is Lm, the internal field of the ferromagnetic yoke 20 is Hm, the length of the TMR element 4 interposed in the gap 20E of the ferromagnetic yoke 20 is Lt, the gap width between the ferromagnetic yoke 20 and the TMR element 4 is Lg/2, the field in the gap is Hg, the diamagnetic field in the TMR element 4 is Hd, and the write current is Iw. In this case, the Maxwell equation yields the following equation (2). The reason for this is that while the TMR element 4 constitutes part of the magnetic circuit, this TMR element 4 also causes a diamagnetic field inside in the direction opposite to that of the magnetic path created by the write current Iw:

$$\text{rot } H = j \rightarrow Hm^*Lm + Hg^*Lx + (Hg - Hd)Lt = Iw, \text{ div } B = 0 \rightarrow Hg = M/\mu_0. \quad \text{Eq. (2)}$$

That is, given the same write current Iw, the gap 20E (the TMR element 4) experiences a stronger field when the TMR element 4 lies in the magnetic circuit than when not. Consequently, the TMR element 4 placed in the magnetic circuit of the ferromagnetic yoke 20 intensifies the field due to its own presence, and can thus cause a magnetization reversal with lower currents. In another respect, the TMR element 4 has a relative permeability that is greater than 1, and thus produces a magnetoresistance that is smaller than that of the air (the gap 20E itself) in the magnetic circuit. This contributes the occurrence of a higher flux density (field*$\mu_0$) for the same current (magnetomotive force). It should be appreciated that this discussion will not hold if magnetization reversal is attempted using an external field alone without the provision of the TMR element 4 in the magnetic circuit.

Since $Hg = Hm\mu_s$, the foregoing equation (2) can be transformed through the following equation (3A) into equation (3B):

$$(Hg/\mu_s)^*Lm + Hg^*Lg + (Hg - Hd)Lt = Iw, \text{ and} \quad \text{Eq. (3A)}$$

$$Hg\mu_0 S^*(Lm/(\mu_s\mu_0 S)) + Hg^*Lg + (Hg - Hd)Lt = Iw, \quad \text{Eq. (3B)}$$

where S is the sectional area of the magnetic path.

Since the magnetoresistance $R = Lm/(\mu_s\mu_0 S)$, the foregoing equation (3B) can be transformed into equation (4):

$$Hg\mu_0 S^*R + Hg^*Lg + (Hg - Hd)Lt = Iw. \quad \text{Eq. (4)}$$

From the foregoing, a scaling rule can be derived as given by equation (5):

$$a \cdot R + b = Iw, \quad \text{Eq. (5)}$$

where $a = Hg\mu_0 S$, and $b = Hg^*Lg + (Hg - Hd)Lt$.

The write current Iw traces a straight line on the magnetoresistance R, and the gradient 'a' is equal to the field Hg acting on the TMR element 4, multiplied by the sectional area S of the magnetic circuit and the space permeability $\mu_0$. The smaller the gap widths Lg/2 between the gap 20E and the TMR element 4 are, and the smaller the length Lt of the TMR element 4 is, the smaller the intercept 'b' accordingly becomes. Thus, the gradient of the scaling rule becomes smaller as the field Hg acting on the TMR element 4 deceases and the sectional area S of the ferromagnetic yoke 20 (magnetic circuit) decreases. The intercept 'b' becomes smaller as the gap lengths Lg and the length Lt of the TMR element 4 decrease. These conditions provide basic guidelines for reducing the write current.

From the foregoing discussion, it is theoretically clear that the write current Iw has a linear relationship with the magnetoresistance R in the present embodiment. As previously shown in FIG. 11, the application of the Maxwell equation is also experimentally reasonable.

In view of the foregoing consideration, in the present embodiment, the ferromagnetic yoke 20 is given a sectional area S of 2E+5 $nm^2$ or less. The reason for this is that the sectional area of the ferromagnetic yoke 20, as mentioned previously, can be reduced to decrease the gradient 'a' effectively based on the scaling rule of the foregoing equation (5). Conversely, to enhance the function of the ferromagnetic yoke 20, this ferromagnetic yoke 20 is preferably made thicker. From the viewpoint of the scaling rule according to the present embodiment, however, it is effective to make the sectional area S of the ferromagnetic yoke 20 as small as possible. Reducing the width (depth) of the ferromagnetic yoke 20 is thus essential when making the ferromagnetic yoke 20 thicker. As a result, the ferromagnetic yoke becomes compact in the plane direction, thereby allowing greater integration of the magnetic storage device 1.

In the present embodiment, the gap widths Lg/2 between the ends of the ferroelectric yoke 20 which form the gap 20E and the TMR element 4 which is accommodated in this gap 20E are set to 10 nm or less. A zero gap width is ultimately preferable. Such smaller Lg can make the intercept 'b' on the scaling rule of the foregoing equation (5) smaller for reduced current consumption.

EXAMPLE

Figure 14:
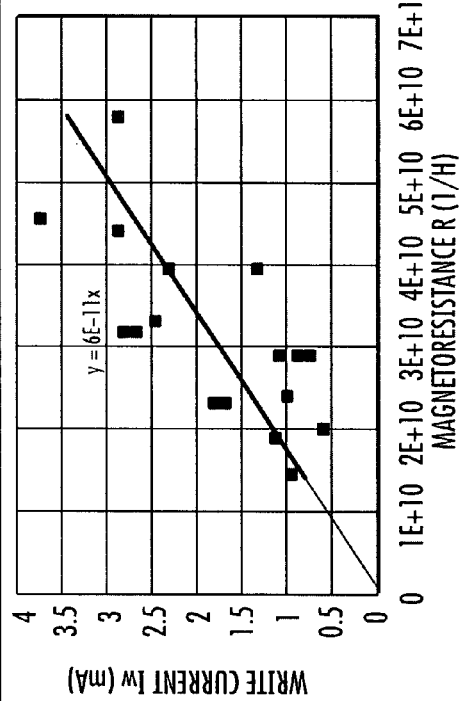
FIG. 14 is a chart showing the results of an analysis of magnetic storage devices according to an example.

For an example, a plurality of magnetic storage devices 1 were fabricated and measured for the current value Iw of the write line 5 when writing information to the TMR element 4. In all the magnetic storage devices 1, the gap lengths (Lg/2) between the ferromagnetic yoke 20 and the TMR element 4 were set to 10 nm. All the magnetic storage devices 1 were also designed so that the gradient 'a' and the intercept 'b' satisfy a (mA·H)$\leq$7.5E$-$11 and b (mA)$\leq$0.1 which are derived from a=Hg$\mu_0$S and b=Hg*Lg+(Hg−Hd)Lt. The results are shown in FIG. 14. Since the rest of the detailed dimensions of the magnetic storage devices 1 are shown in the chart, a description thereof will be omitted.

As can be seen from the chart, in this example, the current value Iw at writing time is as extremely low as below 4 mA in any of the devices, and around 0.54 mA at the minimum. That is, the power saving of the magnetic storage devices 1 is achieved. Moreover, the write current only makes small changes in value with respect to a changing magneto resistance. These magnetic storage devices 1 having this type of yoke can thus be mass-produced with smaller variations in quality (write current value) from one product to another, which facilitates information write control. The regression curve derived from this example (the line that indicates the scaling rule) is Iw (mA)=6E−11×R, which satisfies the foregoing requirements for a and b.

Comparative Example

Figure 15:
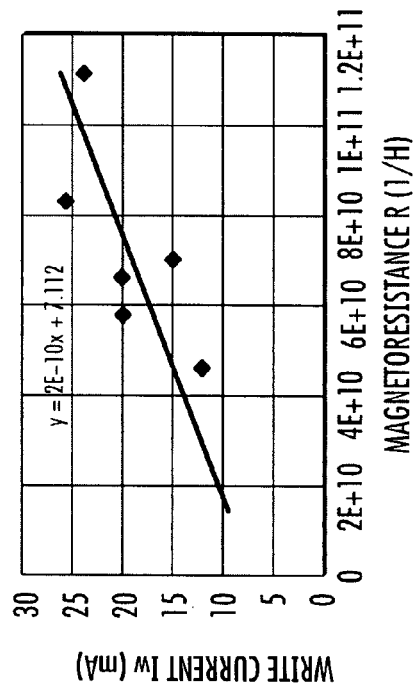
FIG. 15 is a chart showing the results of an analysis of magnetic storage devices according to a comparative example.

For a comparative example, a plurality of magnetic storage devices was fabricated and similarly measured for the current value Iw of the write line 5 when writing information to the TMR element 4. In all the magnetic storage devices 1, the gap lengths between the ferromagnetic yoke 20 and the TMR element 4 were set to 24 nm. All these magnetic storage devices 1 were also designed so that the gradient 'a' and the intercept 'b' satisfy a (mA·H)>1E−10 and b (mA)>5 which are derived from a=Hgµ$_0$S and b=Hg*Lg+(Hg−Hd)Lt. The results are shown in FIG. 15. Since the rest of the detailed dimensions of the magnetic storage devices are shown in this chart, a description thereof will be omitted.

As can be seen from the measurements, in this comparative example, the current value Iw at writing time is as high as above 10 mA in any of the devices, and around 26 mA at the maximum. The current makes large changes in value with respect to dimensional errors (namely, changes in magnetoresistance) of the ferromagnetic yoke 20, which is unsuitable for mass production. The regression curve derived from the measurements of this comparative example (the line that indicates the scaling rule) is Iw (mA)=2E−10×R+7.112.

Up to this point, the magnetic storage device has been described in conjunction with the embodiment thereof. The present invention is not limited to this embodiment, however, and various modification may also be made thereto. For example, while the foregoing embodiment has used TMR elements as the magneto-resistive elements, it is also possible to use GMR elements which utilize the giant magneto-resistive (GMR) effect of CPP (Current Perpendicular to Plane) type. The GMR effect refers to a phenomenon that two ferromagnetic layers laminated with a nonmagnetic layer therebetween change in resistance in a direction perpendicular to the direction of lamination, depending on the angle formed between the directions of magnetization of the ferromagnetic layers. More specifically, in a GMR element, the two ferromagnetic layers show minimum resistances when the directions of magnetization of the ferromagnetic layers are in parallel with each other. The two ferromagnetic layer show maximum resistances when the directions of magnetization of the ferromagnetic layers are in antiparallel with each other. It should be appreciated that TMR elements and GMR elements both may be classified into a pseudo spin valve type in which a difference in coercivity between two ferromagnetic layers is utilized for writing and reading, and a spin valve type in which the direction of magnetization of either one of the ferromagnetic layers is fixed by exchange coupling with an antiferromagnetic layer. A data read on GMR elements is performed by detecting a change in the resistance of their ferromagnetic layers in a direction perpendicular to the direction of lamination. A data write on GMR elements is performed by inverting the direction of magnetization of either one of the ferromagnetic layers with a field caused by a write current.

The foregoing embodiment has dealt with the case where transistors are used as the switching means for controlling the write current and the read current (serving as read-and-write transistors). Nevertheless, this switching means may be practiced by various means having the function of interrupting and passing a current when necessary.

As employed in the present invention, the gap made in the element side yoke refers to the final configuration of the ferromagnetic yoke 20. Thus, an element side yoke 20A of continuous shape may be formed before it is cut to make the gap. Otherwise, respective pieces of the element side yoke 20A may be formed separately.

It is also understood that the magnetic storage device of the present invention is not limited to the foregoing embodiment, and various modifications may be made without departing from the gist of the present invention.

The present invention is widely applicable to the field of recording and retaining various types of information using magneto-resistive elements.

The entire disclosure of Japanese Patent Application No. 2006-177122 filed on Jun. 27, 2006 including specification, claims, drawings, and summary are incorporated herein by reference in its entirety.

What is claimed is:

1. A magnetic storage device comprising:
    a line;
    a yoke made of a magnetic layer covering part of the line; and
    a magneto-resistive element arranged near the line, and wherein
    the magneto-resistive element near the line is capable of writing information by using a field occurring from the line, and
    the device satisfies an equation Iw≦Iwmax, where Iw (mA) is a write current necessary for the line wherein the maximum write current Iwmax (mA) is based on a scaling law that depends on a magneto-resistance R (1/H) of the yoke, where Iwmax (mA)=a·R+b, a (mA·H)=7.5E−11, and b (mA)=0.1, and,
    wherein a gap is formed in part of the yoke in a circumferential direction; and the magneto-resistive element is arranged in or between the gap.

2. The magnetic storage device according to claim 1, wherein the yoke has a sectional area S which is less than or equal to 2E+5 nm$^2$.

3. The magnetic storage device according to claim 1, wherein distances from gap-forming ends of the yoke to the magneto-resistive element accommodated in the gap are less than or equal to 30 nm.

4. The magnetic storage device according to claim 1, and wherein the yoke has a sectional area S which is less than or equal to 2E+5 nm$^2$;
    distances from gap-forming ends of the yoke to the magneto-resistive element accommodated in the gap are less than or equal to 30 nm.

5. The magnetic storage device according to claim 1, wherein the magneto-resistive element has a length of 800 nm or less in a direction of the field.

6. A magnetic storage device comprising:
    a line;
    a yoke made of a magnetic layer covering part of the line; and
    a magneto-resistive element arranged near the line, and wherein
    the magneto-resistive element near the line is capable of writing information by using a field occurring from the line, and
    the device satisfies an equation Iw≦Iwmax, where Iw (mA) is a write current necessary for the line wherein the maximum write current Iwmax (mA) is based on the scaling law that depends on a magneto-resistance R (1/H) of the yoke, where Iwmax (mA)=a·R+b, a (mA·H)= 6.0E-11, and b (mA)=0 wherein a gap is formed in part of the yoke in a circumferential direction; and the magneto-resistive element is arranged in or between the gap.

7. The magnetic storage device according to claim 6, and wherein the yoke has a sectional area S which is less than or equal to 2E+5 nm$^2$.

8. The magnetic storage device according to claim 6, and wherein distances from gap-forming ends of the yoke to the magneto-resistive element accommodated in the gap are less than or equal to 30 nm.

9. The magnetic storage device according to claim 6, and wherein the magneto-resistive element has a length of 800 nm or less in a direction of the field.

10. The magnetic storage device according to claim 6, and wherein the yoke has a sectional area S which is less than or equal to 2E+5 nm$^2$; and the magneto-resistive element has a length of 800 nm or less in a direction of the field.

11. The magnetic storage device according to claim 6, and wherein the yoke has a sectional area S which is less than or equal to 2E+5 nm$^2$;

distances from gap-forming ends of the yoke to the magneto-resistive element accommodated in the gap are less than or equal to 30 nm; and the magneto-resistive element has a length of 800 nm or less in a direction of the field.

* * * * *